(12) United States Patent  (10) Patent No.: US 8,343,794 B2
Frolov et al.  (45) Date of Patent: Jan. 1, 2013

(54) METHOD AND APPARATUS FOR MANUFACTURING MULTI-LAYERED ELECTRO-OPTIC DEVICES

(75) Inventors: Sergey Frolov, Murray Hill, NJ (US); Michael Cyrus, Summit, NJ (US)

(73) Assignee: Sunlight Photonics Inc., South Plainfield, NJ (US)

( * ) Notice: Subject to any disclaimer, the term of this patent is extended or adjusted under 35 U.S.C. 154(b) by 0 days.

(21) Appl. No.: 12/777,392

(22) Filed: May 11, 2010

(65) Prior Publication Data

US 2010/0218897 A1 Sep. 2, 2010

Related U.S. Application Data

(62) Division of application No. 12/034,944, filed on Feb. 21, 2008, now abandoned.

(51) Int. Cl.
*H01L 21/00* (2006.01)
(52) U.S. Cl. .................. 438/63; 438/60; 438/94; 29/29; 136/252; 257/E25.009
(58) Field of Classification Search ..................... 438/55, 438/60, 63, 75, 93, 94, 95, 136; 136/252, 136/244; 29/29; 257/E25.009
See application file for complete search history.

(56) References Cited

U.S. PATENT DOCUMENTS

| | | |
|---|---|---|
| 2,949,498 A | 8/1960 | Jackson |
| 3,978,510 A | 8/1976 | Kasper et al. |
| 4,094,704 A | 6/1978 | Milnes |
| 4,295,002 A | 10/1981 | Chappell et al. |
| 4,335,266 A | 6/1982 | Mickelsen et al. |
| 4,338,480 A | 7/1982 | Antypas et al. |
| 4,477,721 A | 10/1984 | Chappell et al. |
| 4,686,323 A | 8/1987 | Biter et al. |
| 4,798,660 A | 1/1989 | Ermer et al. |

(Continued)

FOREIGN PATENT DOCUMENTS

GB 2400725 10/2004

(Continued)

OTHER PUBLICATIONS

Author Unknown, "Direct and indirect bandgaps", Wikipedia article, http://en.wikipedia.org/wiki/Direct_and_indirect_band_gaps, Sep. 10, 2011.

*Primary Examiner* — William D Coleman
*Assistant Examiner* — Su Kim
(74) *Attorney, Agent, or Firm* — Mayer & Williams PC; Stuart H. Mayer

(57) ABSTRACT

A method is provided for producing a hybrid multi junction photovoltaic device. The method begins by providing a plurality of planar photovoltaic semi-transparent modules. Each of the modules is a fully functional, thin-film, photovoltaic device and includes first and second conductive layers and at least first and second semiconductor layers disposed between the conductive layers. The first and second semiconductor layers define a junction at an interface therebetween. The method continues by disposing the modules one on top of another and hybridly adhering them to each other. At least one of the modules is configured to convert a first spectral portion of optical energy into an electrical voltage and transmit a second spectral portion of optical energy to another of the junctions that is configured to convert at least part of the second spectral portion of optical energy into an electrical voltage.

10 Claims, 12 Drawing Sheets

U.S. PATENT DOCUMENTS

| | | | |
|---|---|---|---|
| 4,984,439 A * | 1/1991 | Smejda | 68/5 C |
| 5,223,043 A | 6/1993 | Olson et al. | |
| 5,282,993 A | 2/1994 | Karg | |
| 5,437,735 A | 8/1995 | Younan et al. | |
| 5,441,897 A | 8/1995 | Noufi et al. | |
| 5,445,847 A | 8/1995 | Wada et al. | |
| 5,482,569 A | 1/1996 | Ihara et al. | |
| 5,567,469 A | 10/1996 | Wada et al. | |
| 5,626,688 A | 5/1997 | Probst et al. | |
| 5,952,081 A | 9/1999 | Lorenz | |
| 5,985,691 A | 11/1999 | Basol et al. | |
| 6,107,562 A | 8/2000 | Hashimoto et al. | |
| 6,258,620 B1 | 7/2001 | Morel et al. | |
| 6,274,804 B1 | 8/2001 | Psyk et al. | |
| 6,340,789 B1 | 1/2002 | Petritsch et al. | |
| 6,420,036 B1 | 7/2002 | Varaprasad et al. | |
| 6,534,704 B2 | 3/2003 | Hashimoto et al. | |
| 6,559,372 B2 | 5/2003 | Stanbery | |
| 6,928,775 B2 | 8/2005 | Banister | |
| 6,974,976 B2 | 12/2005 | Hollars | |
| 7,101,627 B2 | 9/2006 | MacDonald et al. | |
| 7,537,955 B2 | 5/2009 | Basol | |
| 2002/0043279 A1 | 4/2002 | Karg | |
| 2003/0075210 A1* | 4/2003 | Stollwerck et al. | 136/243 |
| 2003/0234038 A1 | 12/2003 | Kurokami et al. | |
| 2004/0045598 A1 | 3/2004 | Narayanan et al. | |
| 2004/0067324 A1 | 4/2004 | Lazarev et al. | |
| 2005/0056312 A1 | 3/2005 | Young et al. | |
| 2005/0088079 A1 | 4/2005 | Daniels | |
| 2005/0236032 A1 | 10/2005 | Aoki | |
| 2005/0266600 A1 | 12/2005 | Basol | |
| 2005/0271827 A1 | 12/2005 | Krunks et al. | |
| 2006/0194371 A1* | 8/2006 | Okazaki et al. | 438/118 |
| 2006/0270236 A1* | 11/2006 | Kusumoto et al. | 438/692 |
| 2007/0065962 A1 | 3/2007 | Pichler | |
| 2007/0173034 A1* | 7/2007 | Tsurume et al. | 438/463 |
| 2008/0057203 A1 | 3/2008 | Robinson et al. | |
| 2008/0057616 A1 | 3/2008 | Robinson et al. | |
| 2008/0121277 A1 | 5/2008 | Robinson et al. | |
| 2008/0121724 A1* | 5/2008 | Beer et al. | 235/492 |
| 2008/0124831 A1 | 5/2008 | Robinson et al. | |
| 2008/0128013 A1* | 6/2008 | Lopatin et al. | 136/244 |
| 2008/0175982 A1 | 7/2008 | Robinson et al. | |
| 2008/0196760 A1 | 8/2008 | Hayes et al. | |
| 2008/0216885 A1 | 9/2008 | Frolov et al. | |
| 2008/0217622 A1 | 9/2008 | Goyal | |
| 2008/0280030 A1 | 11/2008 | Van Duren et al. | |
| 2009/0107550 A1 | 4/2009 | Van Duren et al. | |
| 2009/0162969 A1 | 6/2009 | Basol | |
| 2009/0229666 A1 | 9/2009 | Corneille et al. | |
| 2009/0250105 A1 | 10/2009 | Lee | |
| 2010/0029036 A1 | 2/2010 | Robinson et al. | |
| 2010/0129957 A1 | 5/2010 | Frolov et al. | |
| 2010/0140101 A1 | 6/2010 | Aksu et al. | |
| 2010/0180935 A1 | 7/2010 | Chen | |
| 2010/0184249 A1 | 7/2010 | Chen | |
| 2011/0039366 A1 | 2/2011 | Basol et al. | |

FOREIGN PATENT DOCUMENTS

| | | |
|---|---|---|
| JP | 57153478 | 9/1982 |
| JP | 11-273753 A | 10/1999 |
| JP | 2000-091613 A | 3/2000 |
| JP | 2000-236105 A1 | 8/2000 |
| JP | 2000-315530 A1 | 11/2000 |
| JP | 2003-282916 A | 10/2003 |
| JP | 2006-245507 A1 | 9/2006 |
| WO | 2010138635 | 12/2010 |

* cited by examiner

METHOD AND APPARATUS FOR MANUFACTURING MULTI-LAYERED ELECTRO-OPTIC DEVICES

STATEMENT OF RELATED APPLICATIONS

This application is a divisional of U.S. application Ser. No. 12/034,944, filed Feb. 21, 2008, entitled " METHOD AND APPARATUS FOR MANUFACTURING MULTI-LAYERED ELECTRO-OPTIC DEVICES", which is incorporated by reference in its entirety herein. This application is also related to U.S. patent application Ser. No. 12/034,883, filed Feb. 21, 2008, entitled "Multi-Layered Electro-Optic Devices", which is incorporated by reference in its entirety herein.

BACKGROUND OF THE INVENTION

1. Field

The present invention relates generally to a method and apparatus for manufacturing electro-optic devices and more particularly to a method and apparatus for manufacturing electro-optic devices that have multiple layers and which can be produced by laminating or otherwise integrating two or more discrete electro-optic units or modules.

2. Related art

Photovoltaic devices represent one of the major sources of environmentally clean and renewable energy. They are frequently used to convert optical energy into electrical energy. Typically, a photovoltaic device is made of one semiconducting material with p-doped and n-doped regions. The conversion efficiency of solar power into electricity of this device is limited to a maximum of about 37%, since photon energy in excess of the semiconductor's bandgap is wasted as heat. A photovoltaic device with multiple semiconductor layers of different bandgaps is more efficient: an optimized two-bandgap photovoltaic device has the maximum solar conversion efficiency of 50%, whereas a three-bandgap photovoltaic device has the maximum solar conversion efficiency of 56%. Realized efficiencies are typically less than theoretical values in all cases.

Multi-layered or multi junction devices are currently manufactured as monolithic wafers, where each semiconductor layer is crystal-grown on top of the previous one. As a result, the semiconductor layers are electrically connected in series and have to be current-matched, in order to obtain maximum conversion efficiency.

SUMMARY OF THE INVENTION

In accordance with the present invention, a method is provided for producing a hybrid multi junction photovoltaic device. The method begins by providing a plurality of planar photovoltaic semi-transparent modules. Each of the modules is a fully functional, thin-film, photovoltaic device and includes first and second conductive layers and at least first and second semiconductor layers disposed between the conductive layers. The first and second semiconductor layers define a junction at an interface therebetween. The method continues by disposing the modules one on top of another and hybridly adhering them to each other. At least one of the modules is configured to convert a first spectral portion of optical energy into an electrical voltage and transmit a second spectral portion of optical energy to another of the junctions that is configured to convert at least part of the second spectral portion of optical energy into an electrical voltage.

In accordance with another aspect of the invention, the step of adhering is achieved by sequentially laminating each of the modules to another of the modules.

In accordance with another aspect of the invention, the disposing step includes laterally offsetting the modules from one another.

In accordance with another aspect of the invention, transparent insulating layers are between the modules.

In accordance with another aspect of the invention, a part of the conducting layers of every module is exposed so that they are accessible for connection to external electrical circuits.

In accordance with another aspect of the invention, the step of providing the plurality of modules includes deposition of CIGS based absorber layers.

In accordance with another aspect of the invention, the step of providing the plurality of modules includes deposition of semiconductor absorber layers with different bandgaps optimized for enhanced power conversion efficiency.

In accordance with another aspect of the invention, a method is provided for producing a hybrid electro-optic device. The method begins by providing a plurality of planar electro-optic semi-transparent modules. Each of the modules is a fully functional, thin-film, electro-optic device and includes first and second conductive layers and at least first and second semiconductor layers disposed between the conductive layers. The first and second semiconductor layers define a junction at an interface therebetween. The method continues by disposing the modules one on top of another, hybridly adhering them to each other and applying an electrical contact to the conducting layers of each of the modules.

In accordance with another aspect of the invention, an apparatus is provided for the hybrid manufacturing of a multi-layered electro-optic device. The apparatus includes a roll-to-roll system for feeding a plurality of electro-optic modules, at least one of which is disposed on a flexible substrate. Each of the modules is a fully functional, thin-film electro-optic device and includes first and second conductive layers and at least first and second semiconductor layers disposed between the conductive layers. The first and second semiconductor layers define a junction at an interface therebetween. The apparatus also includes an arrangement for monitoring and maintaining the speed, tension and temperature of the modules as they traverse the roll-to-roll system. At least one pressure roller is provided to exert a compression force for attaching two of the modules on top of each other in a continuous fashion. An aligner system is also provided for positioning and laterally offsetting one of the modules over another of the modules.

In accordance with another aspect of the invention, each module comprises a plurality of segmented modules and the apparatus further includes a view-vision system for selecting good known module segments, separating and detaching the module segments from a carrier film, and removing remaining unused module segments.

In accordance with another aspect of the invention, An apparatus is provided for the hybrid manufacturing of a multi-layered electro-optic device. The apparatus includes a pick and place system for handling a plurality of electro-optic modules, each one being a fully functional, thin-film electro-optic device. Each module includes first and second conductive layers and at least first and second semiconductor layers disposed between the conductive layers. The first and second semiconductor layers define a junction at an interface therebetween. The apparatus also includes at least one pressure member to exert a compression force for attaching two of the modules on top of each other in an automated fashion. An aligner system is provided for positioning and laterally offsetting one of the modules over another of the modules.

In accordance with another aspect of the invention, a process is provided for manufacturing a hybrid electro-optic device. The method includes the step of feeding a plurality of electro-optic modules through a roll-to-roll system. At least one of the modules has a flexible substrate. Each of the modules is a fully functional, thin-film electro-optic device that includes first and second conductive layers and at least first and second semiconductor layers disposed between the conductive layers. The first and second semiconductor layers define a junction at an interface therebetween. The method continues by positioning and laterally offsetting one of the modules over another of the modules and monitoring and maintaining the speed, tension and temperature of the modules while they are being fed through the roll-to-roll system. A compression force is exerted for attaching two of the modules on top each other.

DETAILED DESCRIPTION OF THE INVENTION

Overview

In the following detailed description, numerous specific details are set forth in order to provide a thorough understanding of exemplary embodiments or other examples described herein. However, it will be understood that these embodiments and examples may be practiced without the specific details. In other instances, well-known methods, procedures, components and circuits have not been described in detail, so as not to obscure the following description. Further, the embodiments disclosed are for exemplary purposes only and other embodiments may be employed in lieu of, or in combination with, the embodiments disclosed.

Embodiments of this apparatus and method may facilitate the ability to efficiently and economically convert electromagnetic energy in the form of light into electrical energy in the form of electrical current. Embodiments of this apparatus and method may also facilitate large volume production and widespread usage of photovoltaic devices.

The invention provides an alternative method of producing a multi junction photovoltaic device. As well known in the art, multi junction devices in general are one of the most efficient means for conversion solar energy into electricity. Currently, the best performing solar cells are based on epitaxially grown, crystalline semiconductor multi-junctions. These are complex devices, which are manufactured using difficult and expensive manufacturing processes and their high cost can make them prohibitive for wide spread use and high volume production. This invention, on the other hand, proposes to use substantially less complex and expensive thin-film processing techniques for manufacturing of multi junction photovoltaic devices. Using multi junction design and thin-film technology, a new efficient photovoltaic device with expanded capabilities and application range can be produced.

Thin-film materials, in general and depending on their chemical origin, can be deposited and layered by a variety of different methods, using for example evaporation, sputtering, spraying, inkjet printing etc., most of which could be very inexpensive. Unlike crystalline, lattice-matched semiconductor films, any of these thin film materials can be deposited on a variety of substrates and/or superstrates, including various glasses, polymers, metal sheets, foils and others. This further facilitates the production of efficient and inexpensive photovoltaic media and enables a number of new manufacturing approaches, which are disclosed here.

Figure 1:
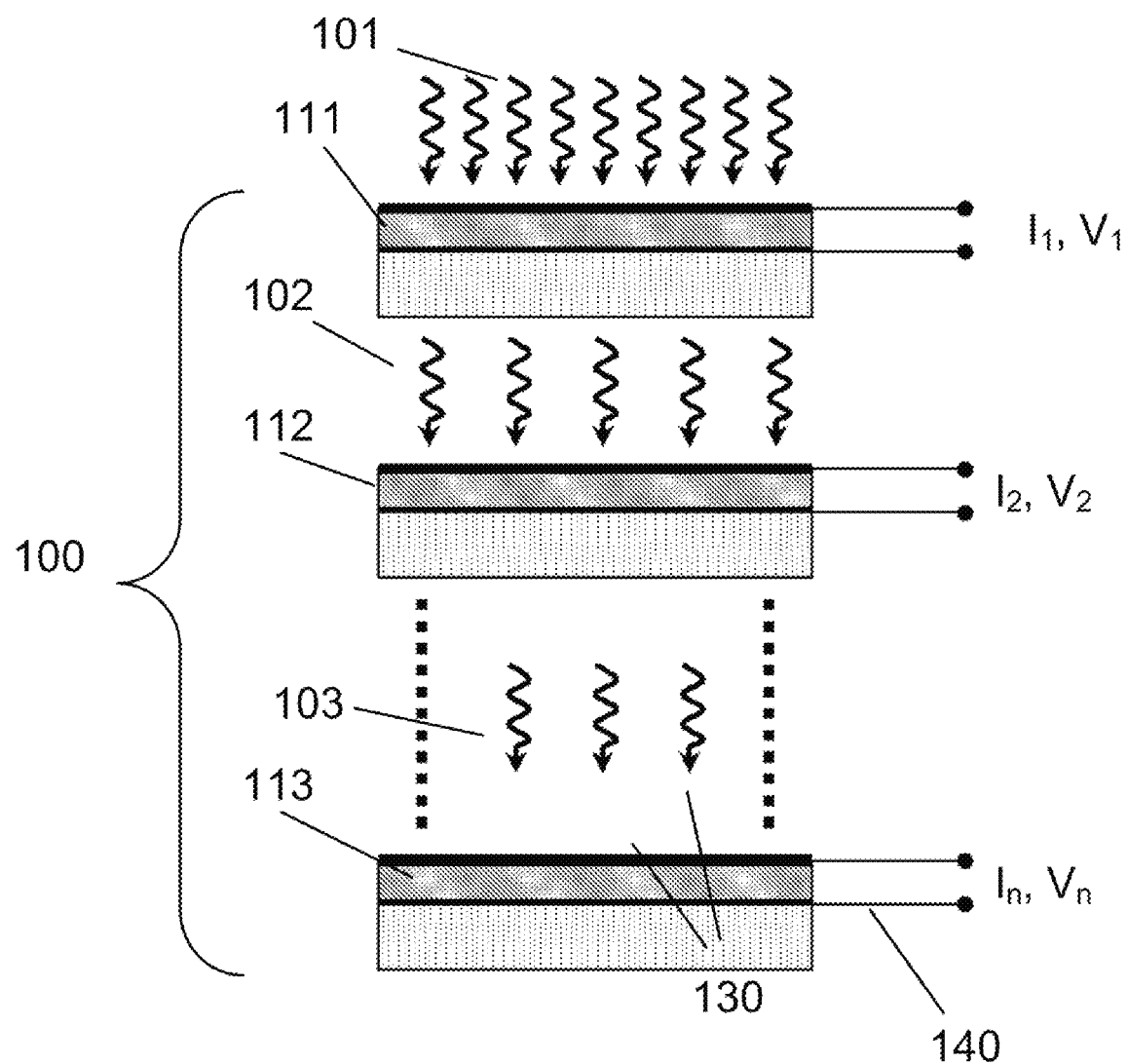
FIG. 1 shows operation of a multi-layered multi junction photovoltaic thin film stack.
Figure 2:
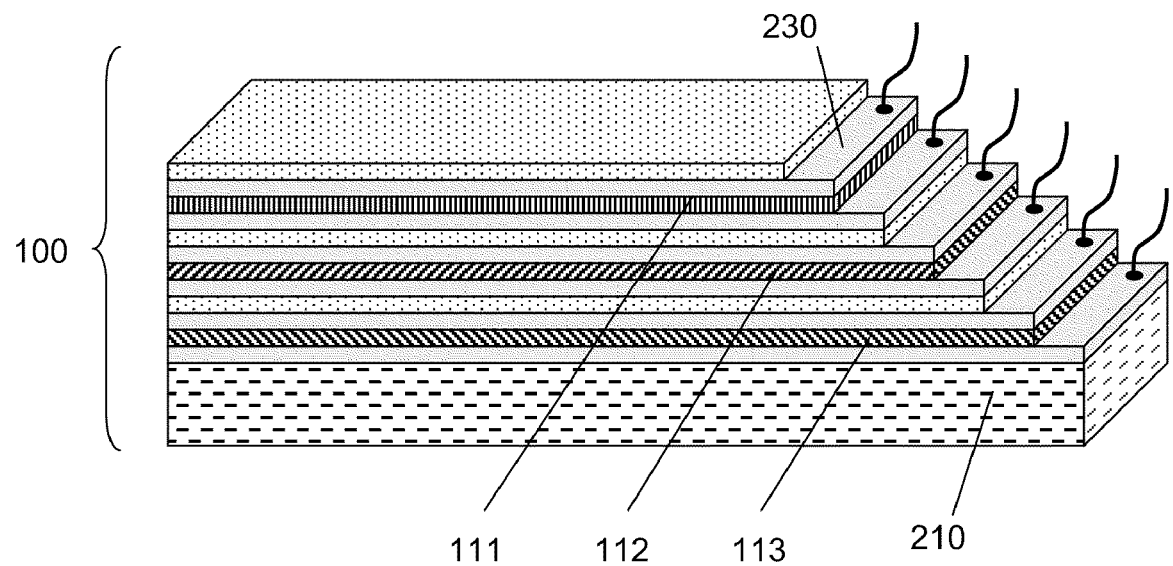
FIG. 2 is a laminated thin-film multi junction photovoltaic device consisting of three modules.

As shown in FIGS. 1 and 2, a multi-layered and multi junction photovoltaic device 100 may be produced from two or more photovoltaic modules such as the three photovoltaic modules 111, 112 and 113 shown in FIGS. 1 and 2. Each of the photovoltaic modules 111, 112 and 113 includes one or more junctions formed from an optically active semiconductor having a specific bandgap. When photovoltaic device 100 is illuminated by light 101, one of its junction layers may absorb a part of light with photon energies above a corresponding bandgap and transmit a part of light (i.e. light 102 and 103) with photon energies below a corresponding bandgap. The junctions within and between modules may be arranged so that the bandgaps of lower lying junctions are smaller than the bandgaps of higher lying junctions; this condition improves the conversion efficiency of the device. Furthermore, these modules may be electrically isolated from each other and provided with two individual electrical contacts 130 of opposite polarity for producing electrical current connectors 140.

Figure 3:
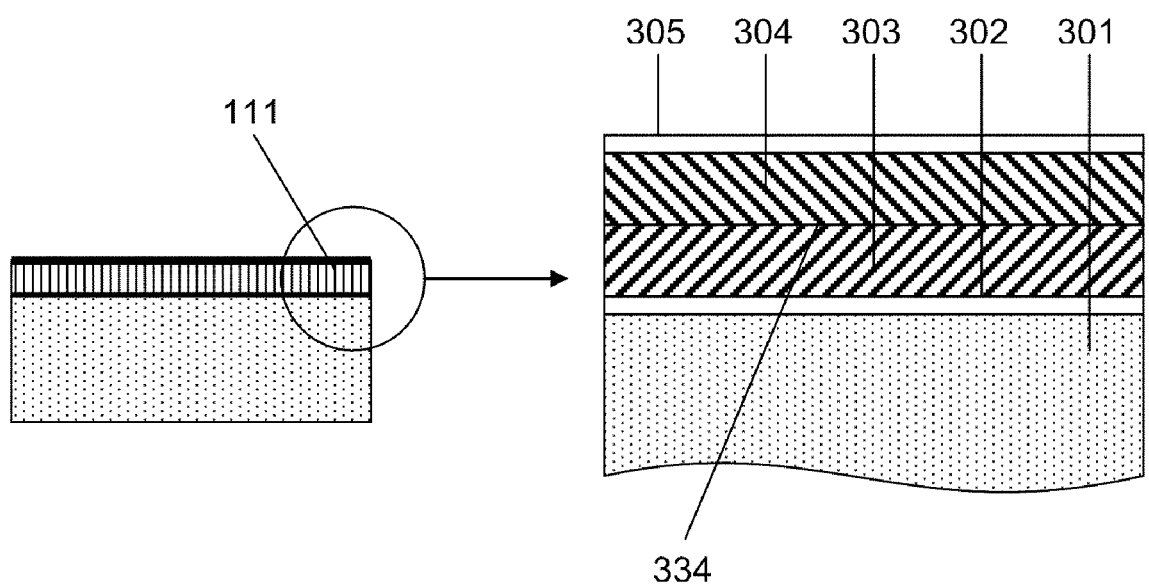
FIG. 3 is the cross-section of a single junction photovoltaic module.

FIG. 3 shows an example of a single photovoltaic module 111, which may be representative of the type of modules employed in the photovoltaic device 100 shown in FIGS. 1 and 2. In this example module 111 includes at least two semiconductor layers 303 and 304 that define a junction at their interface 334. If more than two semiconductor layers are employed, the module 111 will include multiple junctions. The junction may be a heterojunction in which the layers 303 and 304 are formed of dissimilar materials. Alternatively, the junction or junctions may be of any type known in the art such as, but not limited to p-n junctions, p-i-n junctions, MIS junctions and the like. The module 111 may include additional semiconductor and buffer layers that alter or improve the device performance. Photovoltaic module 111 also includes transparent conducting layers 302 and 305, so that all of layers 302-305 are situated in a monolithic stack on a substrate 301. In summary, a single module (e.g. modules 111, 112 and 113) includes at least a substrate, two conducting layers, and two or more semiconductor layers (which form 1 or more junctions). An individual module from time to time may be referred to herein as a subcell.

As previously noted, the number of photovoltaic modules, N may be larger than two: the greater the number of modules, the higher is the maximum achievable conversion efficiency. It should be noted that a photovoltaic device that is formed from N modules includes N or more junctions, depending on the number of semiconductor layers in each module. The number of junctions in each module forming a single photovoltaic device may or may not be the same. Also, the semiconductor materials that are employed in the modules may be, for example, a compound semiconductor formed from an inorganic, polymer-based material, an organic dye-based material, a nanoparticle composite material, a quantum dot composite material, or a mixture of the above materials. The specific material composition used in each module will generally be optimized for the particular photovoltaic device that is being designed. These modules forming the photovoltaic device are situated in a stack and further processed so that they adhere to one another.

A number of electro-optic materials have been developed in recent years that are suitable for thin film processing techniques, including CdTe, CIGS (Copper Indium Gallium Selenide), organic and polymer semiconductor. These thin-film technologies greatly simplify the production of a multi-junction, non-single crystalline (e.g., polycrystalline, amorphous) photovoltaic device. Unlike wafer-based semiconductor technologies that use such materials as Si, Ge, GaAs and GaInP, thin-film technologies allow deposition of functional semiconductor thin films only few microns thick on a variety of substrates including flexible substrates. Furthermore, it generally enables the production of large area, single-sheet, multi-layered electro-optic devices, e.g. using roll-to-roll manufacturing. The latter is not possible using a standard single-crystal semiconductor technology due to the typically limited and small size of semiconductor wafers. As a general rule, thin film materials are typically direct bandgap semiconductors, unlike some of the single crystal semiconductors, such as Si and Ge.

Thin-film layers formed from various semiconductors may be manufactured separately as large sheets on independent substrates. These sheets then could be attached, glued, laminated, or otherwise hybridly joined, together to form a single large area, integrated multi junction device. Since multiple junction layers are hybridly integrated into a single sheet, they can be produced and optimized independently from one another. All of the individual photovoltaic modules may be attached to a common substrate that may be sturdy yet flexible. The substrate also may be coated with a reflective layer. One or more surfaces in this device could be textured to provide a relief pattern for multiple light reflections and scattering, which improves light absorption and subsequently its power conversion efficiency.

A large number of different semiconductor materials are currently available and known to be suitable for thin-film manufacturing. One advantage of this invention is that its approach is universal and does not rely on a particular material. Some examples of currently available semiconductors could be divided into two large groups: organic and inorganic semiconductors. Organic semiconductors include various types of π-conjugated polymers and oligomers. Although they are particularly suitable for low-cost manufacturing and could be deposited by simple evaporation, their photovoltaic performance is not yet as good as that of inorganic semiconductors. Suitable inorganic materials include CdTe, CIGS, a-Si and the like. All these semiconductors tend to have a direct bandgap and subsequently strong optical absorption at photon energies above the bandgap. Thus a rather thin film of only few microns thick could absorb most photons and achieve very high quantum efficiency.

In the present invention individual modules may be first produced from the aforementioned materials using known thin film technologies. The modules may be manufactured using transparent conducting layers and preferably transparent substrates. Alternatively, an opaque sacrificial substrate may be used that subsequently could be detached and discarded or reused. After fabricating the individual modules they may be assembled in a single stack and hybridly attached to each other according to the techniques discussed below.

This approach to fabrication of multi junction photovoltaic devices is very flexible and can be tailored for a very large variety of semiconductor materials. However, there are some specific requirements which need to be met in most cases: (1) the conducting layers in the individual modules should be substantially transparent to light with photon energies below the bandgap of a corresponding semiconductor layer; (2) the bandgaps of a semiconductor material in a light absorbing layer of each junction module should satisfy the relation (in the order from top to bottom):

$$E_1 > E_2 > \ldots > E_n \quad (1)$$

where n is the number of junctions in the photovoltaic device; (3) most of the materials used in the manufacturing of laminated multi junction solar cell, including conducting, semiconducting and insulating layers, should be compatible with low temperature, low cost thin-film manufacturing methods and processes; (4) some of the individual modules are preferably flexible to facilitate the lamination process; (5) most of the exposed surfaces should be optically smooth (roughness is smaller than the wavelength of light) in order to avoid excessive light scattering.

In most cases there may be only a few exceptions to these requirements. For example, the bottommost conducting layer need not be transparent. Since there are no additional modules below it, this layer could be either opaque or reflective, in the latter case increasing light absorption and subsequently its conversion efficiency. Also, conducting layers may include partially transmitting metal grids for reducing in-series resistance of corresponding modules. Furthermore, at least one of the modules could be manufactured using approaches other than thin-film technology, as long as additional modules can be added hybridly, e.g. via sequential lamination. Although, it is preferable to use substrates that are optically smooth on both sides, it may be possible to reduce the effect of optical scattering on the rough substrate surfaces by adding intermediate refractive index-matching layers between modules. Such layers could also perform dual functions; as for example a thin adhesive layer may bond together two adjacent modules and at the same time smooth out an optical interface between these modules, so that optical scattering between them is reduced.

Hybrid integration of multiple modules on a single substrate enables several intermediate, but critical testing procedures. Since all of these modules can be manufactured separately to produce fully functioning photovoltaic cells, the resulting cells or modules, could be tested and screened on performance before they are assembled into a fully stacked multijunction device. Thus only good known modules will be used in the eventual assembly and attachment process. This procedure makes a tremendous difference in the overall production yield, performance and cost of the multi junction photovoltaic devices. For example, if three modules, each with a single junction, are hybridly integrated have a 50% yield each, then the overall manufacturing yield of this integrated triple junction photovoltaic device will still be 50% (assuming nearly 100% yield in the process of assembling the subcells). On the other hand, a monolithically integrated device, in which the same three junctions are grown or deposited sequentially on the same substrate, will have 12.5% manufacturing yield, due to the fact that one cannot pick and choose the good parts in this process and thus the total yield is the product of all fractional yields for each junction layer. The difference in yield becomes even more dramatic if the individual modules each contain more than one junction.

Figure 4:
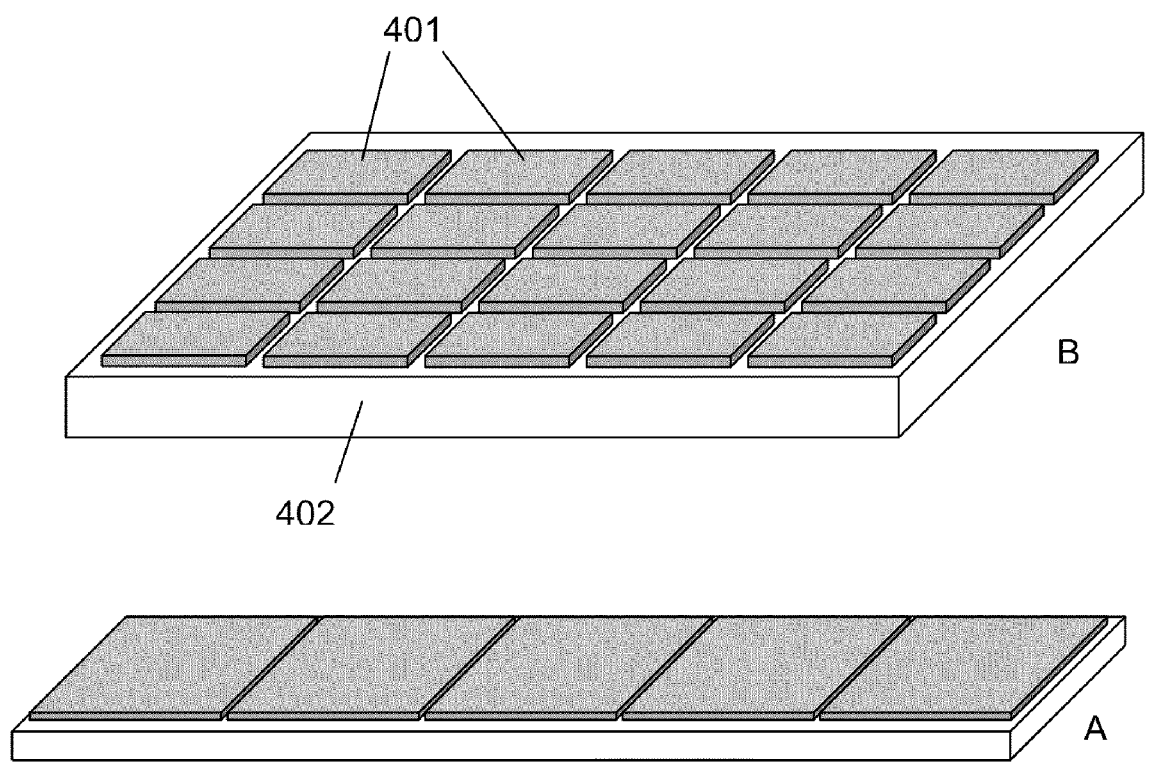
FIG. 4 shows examples of a photovoltaic module segmentation in one dimension (A) and two dimensions (B).

A plant for large volume manufacturing of thin-film solar cells would typically use roll-to-roll or similar large area processing facility. To facilitate the selection process of good known parts for further integration into photovoltaic devices, individual subcells could be segmented as shown in FIG. 4 for one-dimensional (A) and two-dimensional segmentation (B). All of the segments or subcells 401 in this instance are nominally identical and manufactured simultaneously on the same roll of film, foil or substrate 402. These subcells, however, are electrically and physically separated from each other, so that they can be tested both optically and electrically and selected on the basis of their individual performance. Thus only the best performing sections of a particular module could be separated, diced out, peeled off or otherwise detached from the rest of the substrate roll. Thus selected sections could then be used in the hybrid assembly of multi-junction devices.

Figure 5:
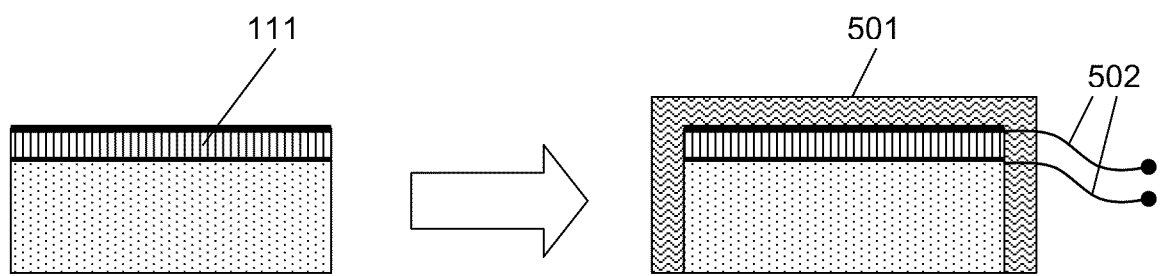
FIG. 5 shows a known method of solar cell encapsulation by lamination.

Lamination technology is currently used in solar cell manufacturing primarily for encapsulation and protection from adverse environmental conditions. Lamination is defined herein as a method of sandwiching two layers, one of which may be a plastic or other flexible film, with the application of pressure and/or heat, usually with an adhesive layer between them. Both of these layers are pre-manufactured as standalone layers. FIG. 5 shows prior art applications of laminates in solar cell manufacturing, in which one or more coats of protective plastic 501 are laminated above and/or underneath the module 111. They may also be used to protect part of electrical leads 502. The protective laminated films are electrically inactive and play no direct role in the operation of a photovoltaic device. On the other hand, in the present invention the lamination process is used to attach optically and electrically active layers. In fact, each one of the laminated layers is an independent fully functioning photovoltaic cell.

Figure 6:
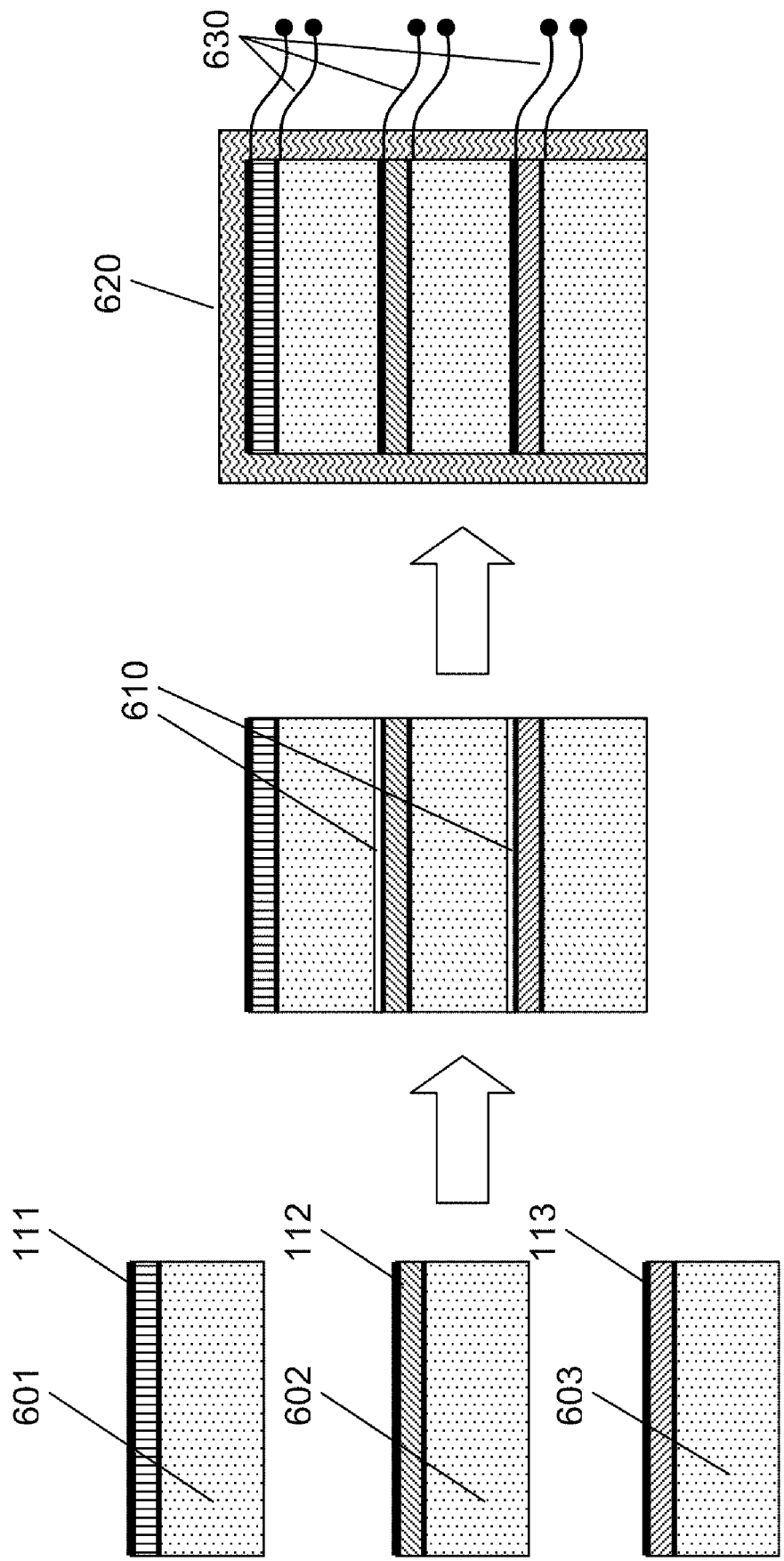
FIG. 6 shows the steps of laminating three separate photovoltaic modules followed by encapsulation.

FIG. 6 shows schematically an approach of producing thin-film multijunction photovoltaic devices in accordance with the present invention. The method includes the following steps: (1) laminating together two or more modules such as the three modules 111, 112 and 113 are shown in FIG. 6, which include transparent substrates 601, 602 and 603, respectively, and, optionally (2) laminating an additional protective coating 620 over the whole stack and part of electrical leads 630. The last step may be redundant due to existing protective layers in the laminated modules. Additional bonding or adhesive layers 610 may be required in the first lamination step to form a bond between the bottom of a substrate of an upper module with the top of the conductive layer of a lower module. Further additional steps in this manufacturing process may include making electrical contacts with each exposed cathode and anode in the stack and providing respective electrical current paths 630 to an external circuit.

While the present invention has been described in terms of a photovoltaic device that is formed from two or more photovoltaic modules that are hybridly integrated in a multi-layered stack, the present invention encompasses other types of devices as well. That is, in addition to photovoltaic cells or modules, other types thin-film electro-optic modules can be hybridly integrated in a multi-layered stack. For example, large area light emitting devices (LEDs) can be laminated in a stack of multiple LEDs on top of each other. This could be done for different purposes, e.g. to achieve higher brightness, different colors, white-light emitting multi-layered LEDs and others. Furthermore, segmented multi-layered LEDs could be used as displays, in which each segment represents a separate pixel. Unlike conventional pixels, these pixels could produce true color emission across a large area. Similar to the modules used to form a photovoltaic device, the modules uses to form these other types electro-optic devices include at least a substrate, two conducting layers, and two or more semiconductor layers (which form 1 or more junctions).

Existing lamination techniques can be modified and adopted for use in the lamination of thin film electro-optic devices such as photovoltaic devices. FIGS. 7-12 show examples of the lamination processes, which include roll-to-roll lamination of flexible films with rigid substrates and flexible films, multiple film lamination, segmented film lamination, segmented panel-to-panel lamination and others. A variety of lamination methods could be adopted in manufacturing of thin-film multi junction electro-optic devices. These methods include wet lamination, dry lamination, pressure, thermal lamination, hot-melt lamination, chemical lamination, UV-assisted lamination, extrusion lamination and combinations thereof. Most of these approaches have to be tailored to work with specific thin-film materials and multi junction designs.

EXAMPLES

FIG. 2 shows an exemplary embodiment of the invention, in which three different photovoltaic modules 111, 112 and 113 are utilized. Maximum sunlight power conversion efficiency of this architecture is about 56% for highly concentrated sunbeam and about 50% for regular sunlight intensity (so called condition AM1.5). All three modules contain active polycrystalline semiconductor materials based on, for example, a CIGS (Copper Indium Gallium Selenide) material system or a related alloy, and the corresponding junctions are produced using single junction designs known in the art. By varying the In and Ga relative concentrations the bandgaps in layer 111 may be adjusted to about 1.7 eV, in layer 112—to about 1.4 eV and in layer 113—to about 1.1 eV. The thickness of each layer may be in the range of 1 to 5 microns. Each module may also contain buffer layers, such as, for example, a thin CdSe layer with a thickness in the range of 10 to 1000 nm. The semiconductor layers in each module may be located between appropriately matched transparent conducting layers 130. The conducting layers 130 may be formed from thin layers of ITO or ZnO with a thickness in the range of 0.1 to 5 µm. Each module also includes a substrate, such as a polyimide film, with a thickness in the range from 10 to 1000 microns, which is transparent in the appropriate spectral range and which is used primarily as a carrier for other layers in the module. These modules are laminated so that they adhere to each other to form a single laminate film with multiple individual electrical contacts for each module.

The various modules shown in FIG. 2 may be also laminated onto a common carrier substrate 210, such as a thin polyimide film with a thickness in the range of 25 to 1000 microns. This substrate may be coated with metal such as Al, Mo, Au or Cu to reflect unabsorbed light back into the individual modules. As shown, the modules may be staggered or laterally offset from one another so that each conducting layer 130 has an exposed region 230. The exposed regions 230, which may be covered with additional metallization pattern to provide better conductivity, serve as surfaces that can connect the modules to external electrical circuits. As a result, the three modules shown in the device of FIG. 2 may have up to six electrical output connectors.

In yet another embodiment, the apparatus and method described above and shown in FIG. 2 may be modified, so that some of the modules include a substrate made from polyamide.

In yet another embodiment, the apparatus and method described above and shown in FIG. 2 may be modified, so that some of the modules are in addition coated on at least one of the surfaces with a thermosetting resin such as ethylene-vinylacetate (EVA).

In yet another embodiment, the apparatus and method described above and shown in FIG. 2 may be modified, so that some of the modules are coated with a thin protective plastic film, such as polyethylene terephthalate (PET), on the side opposite from the substrate, so as to protect sensitive electronic parts of the module during the lamination process.

In yet another embodiment, the apparatus and method described above and shown in FIG. 2 may be modified, so that the carrier substrate, such as silicone, is transparent and is attached and laminated on the top of the first module 111.

In yet another embodiment, the apparatus and method described above and shown in FIG. 2 may be modified by laminating additional conducting films, foils or wires, so that three of electrical output connectors may be shorted or connected to the ground without loss of device functionality.

In yet another embodiment, the apparatus and method described above and shown in FIG. 2 may be modified, so that additional modules having junctions with different bandgaps may be laminated and provided with additional individual electrical contacts. In this embodiment the total number of junctions and bandgaps may be greater than four, and the bandgap values are chosen to maximize device conversion efficiency for a given number of junctions. Some of the electrical outputs may be interconnected locally or via an external circuit, so as to produce either in series connection, in parallel connection, common anode or common cathode configurations or combinations thereof.

In yet another embodiment, the apparatus and method described above and shown in FIG. 2 may be modified, so that the junction layers may be produced on separate sacrificial substrates and detached from these substrates before or during the lamination process.

In yet another embodiment, the apparatus and method described above and shown in FIG. 2 may be modified, so that the modules may be bonded together to produce a single multi-layered photovoltaic film.

In yet another embodiment, the apparatus and method described above and shown in FIG. 2 may be modified, so that the modules may be glued together to produce a single multi-layered photovoltaic film.

In yet another embodiment, the apparatus and method described above and shown in FIG. 2 may be modified, so that the modules are segmented and laminated onto a single carrier substrate.

In yet another embodiment, the apparatus and method described above and shown in FIG. 2 may be modified, so that some of the modules are laminated together so that their substrates are exposed to the light that is to be converted.

In yet another embodiment, the apparatus and method described above and shown in FIG. 2 may be modified, so that the modules that are stacked and hybridly attached to each other are light emitting modules (LEM). Each LEM could be activated and operated independently from the others. Furthermore, each LEM contains an emitting semiconductor layer with a different characteristic bandgap and thus different characteristic emission spectrum. Thus, different emission spectra from different LEMs could be combined to produce different color combinations including that of white light. Also, independent control of emission intensities can be achieved by varying the different currents supplied to different LEMs, which allows one to continuously vary and change the color of the combined emission of the LEM stack. Furthermore, each LEM may be segmented into an array or a matrix of individual light emitting pixels with individual electrical controls, so that a stack of segmented LEMs will function as a bright, efficient, true color display.

In yet another embodiment, the apparatus and method described above and shown in FIG. 2 may be modified, so that the modules that are stacked and hybridly attached to each other are electro-optical sensors. Some of these sensors may be configured to analyze an optical spectrum. That is, the sensor modules may comprise a stack of layers with multiple quantum dots each having independent electrical output so that they function as a spectrum analyzer of the absorbed light. Other sensors may be configured to probe temperature, moisture, impurity content, various specific airborne chemicals and other atmospheric conditions. Furthermore, the sensor modules could include micro-fluidic channels and chemical sensors and may be further segmented to be sensitive and responsive, for example, to specific DNA strands, thus enabling the resulting device to conduct DNA analysis or other types of complex chemical analysis.

Figure 7:
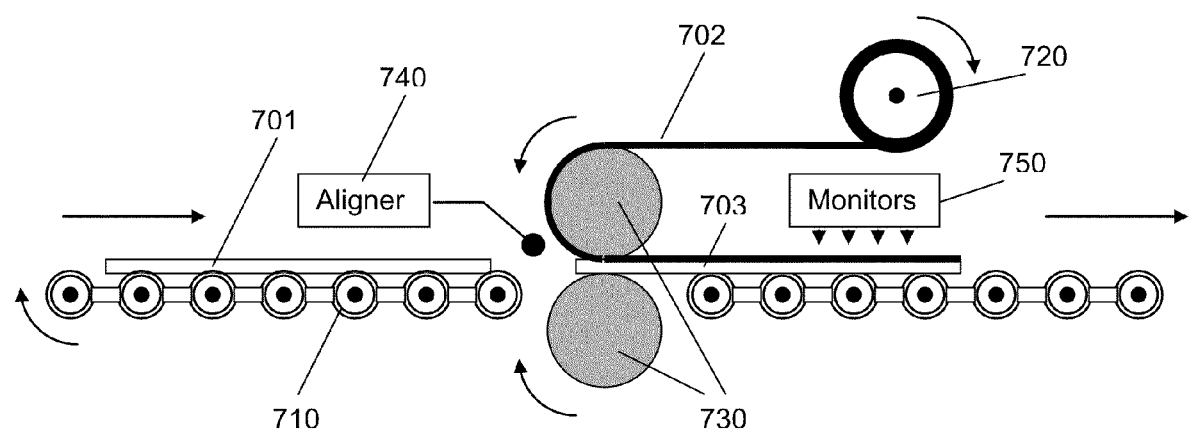
FIG. 7 is an apparatus and process for laminating one photovoltaic module having a flexible substrate on top of another photovoltaic module having a rigid substrate using thermal and pressure lamination techniques.

FIG. 7 shows an exemplary embodiment of the invention, in which an apparatus and a process are shown for laminating one photovoltaic module 702 on a flexible substrate, such as a high temperature polyimide film, onto another photovoltaic module 701 deposited on a rigid substrate, such as soda lime glass. Module 701 may be in the form of a panel, i.e. a flat sheet of rigid or semi-rigid material, the size of which is on the same order of magnitude as the size of a typical solar cell panel (e.g. 50 cm by 100 cm) and thus may fit entirely onto rollers 710. Several lamination methods could be used including pressure lamination and thermal lamination. A combination of these two methods could be implemented using a thermosetting adhesive layer of EVA. Module 701 can be coated with a thin ethylene vinyl acetate (EVA) layer with a thickness of about 10-20 microns, after which rollers 710 feed the prepared substrate towards hot rollers 730. Those in turn apply pressure 5-10 kg/cm$^2$ and heat to achieve local temperatures of about 100° C. at the modules' contact point, causing the EVA to melt and bond the modules together forming a stack 703 that defines a two-module photovoltaic device. Generally, relatively thin adhesion layers are necessary for better optical transmission between stacked modules, as compared with the current standard lamination and encapsulation techniques. Roller 720 feeds the film with module 702 and maintains the correct tension in the film. Module 702 may be laminated either substrate side down or substrate side up. In the latter case the substrate of module 702 will also serve as the top protection layer of the combined module 703.

In yet another embodiment, the apparatus and method described above and shown in FIG. 7 may be modified by including an aligner 740, so that the laminated module 702 may be aligned, laterally offset and attached to the module 701 to thereby expose electrical contacts on both modules for subsequent connections to external electrical circuits. Current lamination techniques generally do not provide such alignment capabilities and precision positioning in the attachment process, and therefore are mostly useful for encapsulation. Furthermore, additional monitors, sensors and gauges 750 may be used to monitor and report processing parameters, such as pressure, temperature and humidity, as well as module conditions, such as feeding speed, film tension, attachment failures and others.

In yet another embodiment, the apparatus and method described above and shown in FIG. 7 may be modified, so that the laminated modules 701 and 702 have metal grids on at least one of their conducting layers in order to reduce contacts ohmic resistance. These metal grids may have matching patterns. Furthermore, aligner system 740 may then be also used to align the two metal grids exactly on top of each other, in order to avoid cross-shadowing, in which the light shadow from the upper metal grid is not overlapping with the light shadow from the lower grid.

In yet another embodiment, the apparatus and method described above and shown in FIG. 7 may be modified, so that the laminated module 702 is a multi junction laminate film consisting of at least two different laminated photovoltaic modules.

Figure 8:
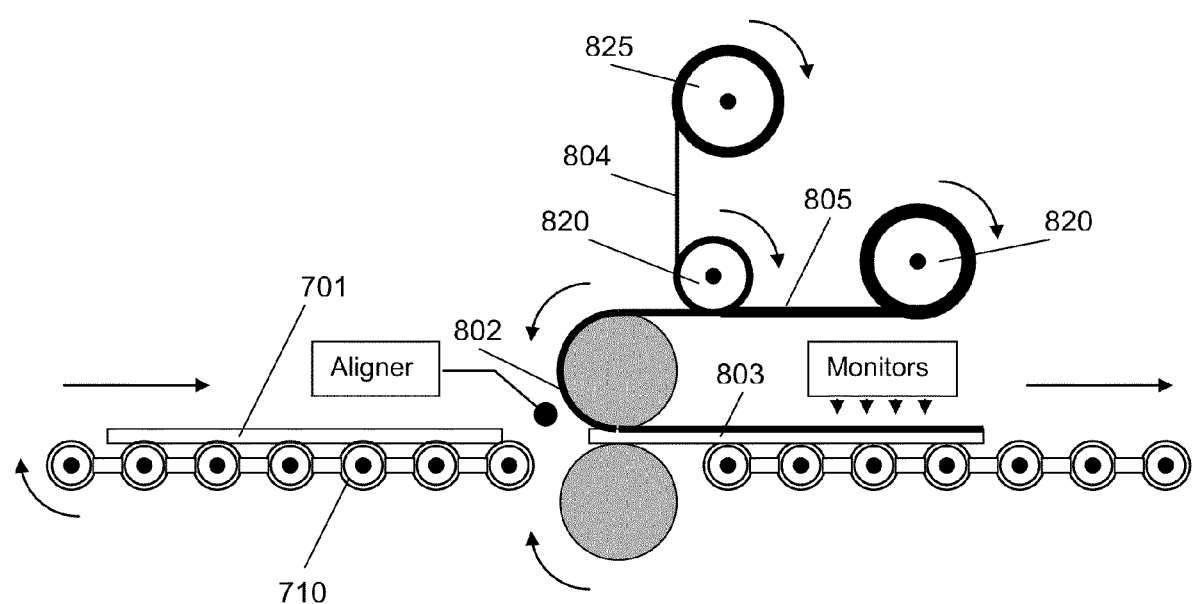
FIG. 8 is an apparatus and process for laminating one photovoltaic module having a flexible substrate on top of another photovoltaic module having a rigid substrate using a sacrificial peal-off film substrate.

FIG. 8 shows an exemplary embodiment of this invention, in which an apparatus and a process are shown for laminating a module 802 having a flexible substrate onto another module 701 having a rigid substrate. A sacrificial flexible carrier substrate 804 is used in this case to facilitate the lamination process and reduce the overall thickness of a resulting multi junction device. Carrier substrate 804 may be laminated to module 802 in advance using, for example, cold lamination with a pressure sensitive adhesive to produce a composite film 805. Module 802 may pealed off and separated from the carrier 804 using rollers 820 and 825. This approach allows one to use a thinner flexible substrate in module 802, thus reducing the overall thickness of the resulting device 803 to thereby improve light transmission between the modules.

Figure 9:
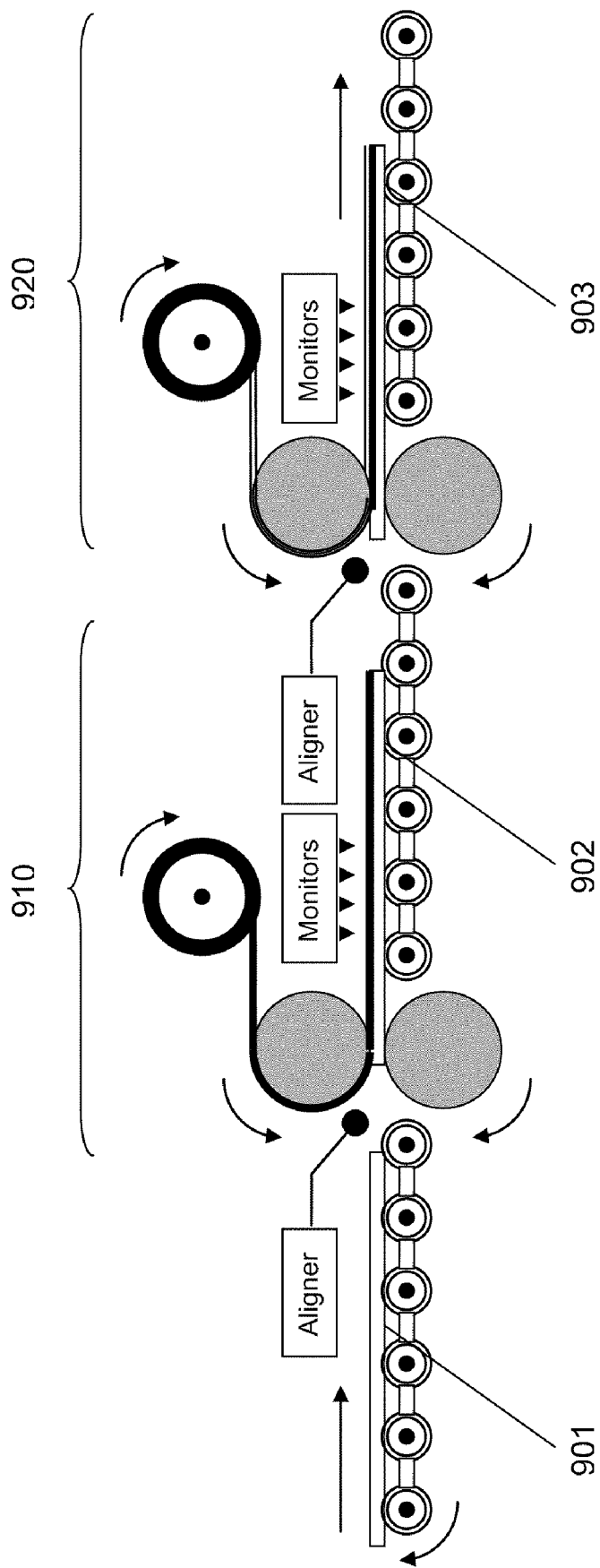
FIG. 9 is an apparatus and process for laminating multiple photovoltaic modules having flexible substrates on top of another photovoltaic module having a rigid substrate using thermal and pressure lamination techniques.

FIG. 9 shows an exemplary embodiment of the invention, in which an apparatus and a process are shown for laminating two (or more) modules 910 and 920 having flexible substrates onto another module 901 having a rigid substrate, to produce sequentially laminated stacks provided by laminating units 902 and 903, respectively.

Figure 10:
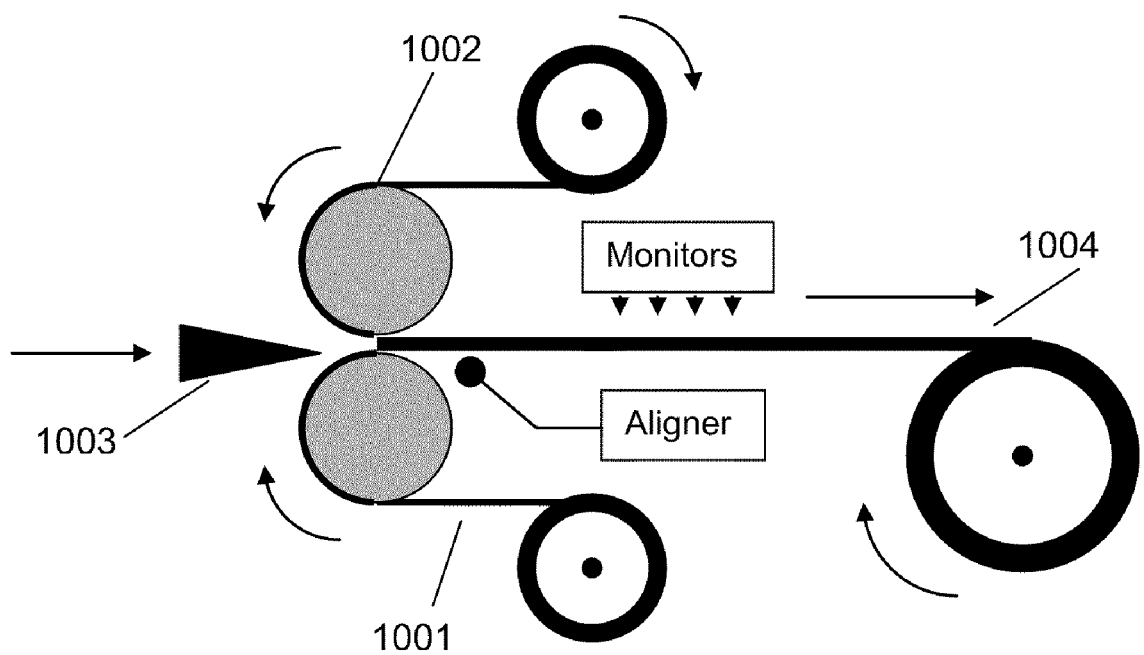
FIG. 10 is a roll-to-roll apparatus and process for laminating one photovoltaic module having a flexible substrate on top of another photovoltaic module having a flexible substrate using extrusion lamination techniques.

FIG. 10 shows an exemplary embodiment of the invention, in which an apparatus and a process are shown for laminating together two modules 1001 and 1002, which both have flexible substrates. Although different lamination methods could be used, including pressure lamination, thermal lamination and others, extrusion lamination may be particularly adaptable for this process, in which a thin layer of melted adhesive 1003 is applied between the modules, followed by cooling and rolling into a roll 1004.

Figure 11:
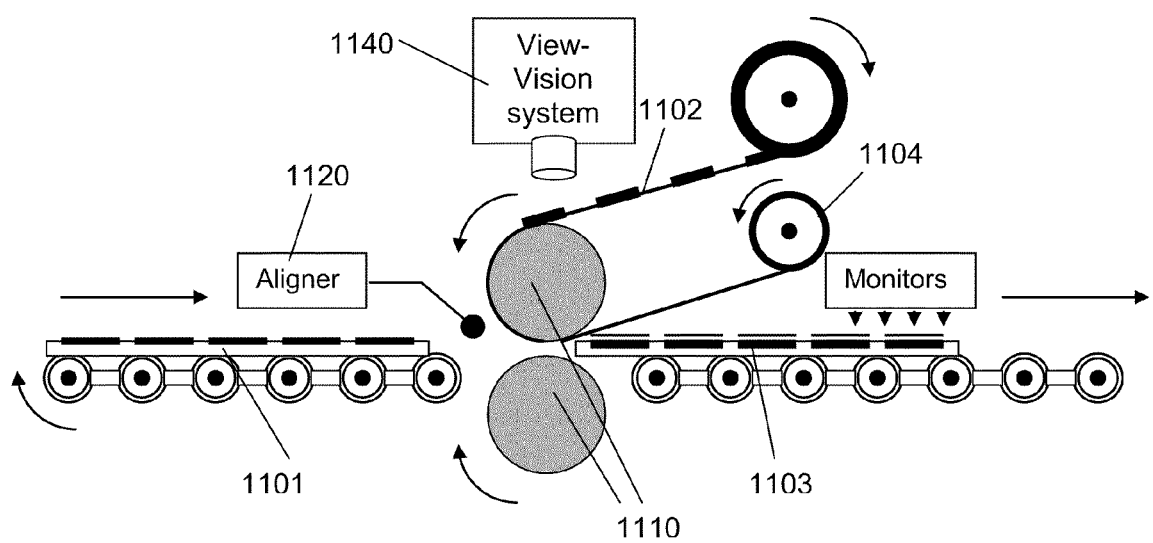
FIG. 11 is an apparatus and process for laminating one segmented photovoltaic module having a flexible substrate on top of another segmented photovoltaic module having a rigid substrate using thermal and pressure lamination techniques.

FIG. 11 shows an exemplary embodiment of the invention, in which an apparatus and a process are shown for laminating a segmented electro-optic module 1102 onto another segmented electro-optic module 1101 to form a segmented electro-optic laminate 1103. Segmented electro-optic module 1102 includes a flexible substrate and segmented electro-optic module 1102 includes a rigid substrate. A sacrificial flexible carrier film 1104 may be used in this process. Furthermore, each segment of the modules 1101 and 1102 may represent a previously tested, good known part. Laminating rollers 1110 and aligner 1120 are used to align and attach the respective segments of modules 1101 and 1102 to one another as monitored and controlled via a view-vision system 1140. The lamination rollers 1110 also serve to peal off the sacrificial substrate 1104.

Figure 12:
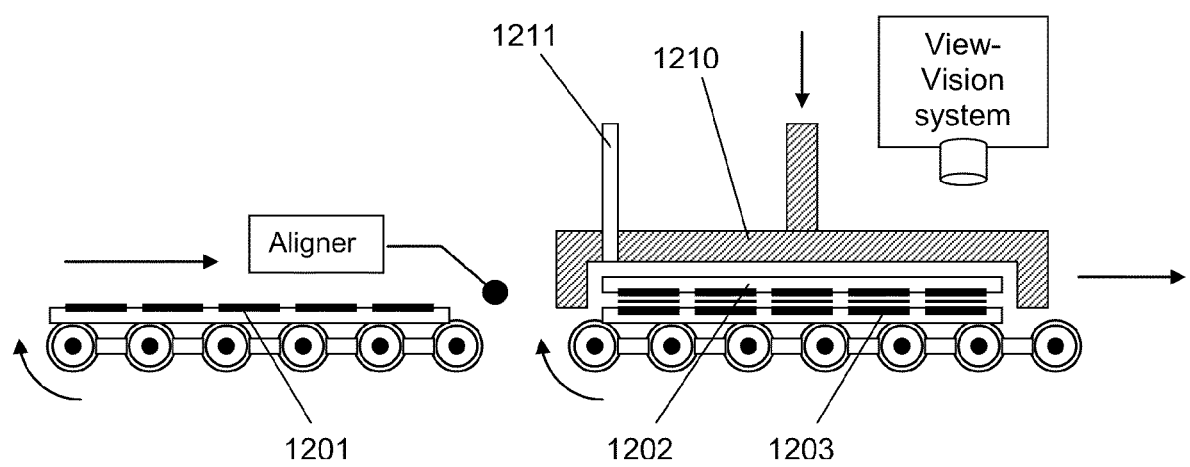
FIG. 12 is an apparatus and process for laminating one segmented panel-size photovoltaic module on top of another segmented panel-size photovoltaic module having a rigid substrate using vacuum lamination techniques.

FIG. 12 shows an exemplary embodiment of the invention, in which an apparatus and a process are shown for laminating a segmented electro-optic module of an individual panel 1201 onto another segmented electro-optic module of an individual panel 1202. Each segment of the processed modules may represent a good known part. Individual panels may be made from either rigid or flexible substrates to satisfy the aforementioned multi-layer electro-optic hybrid integration requirements. In this embodiment, pick-and-place robotic tools 1210 may be used to facilitate high volume production and minimize manufacturing costs. Also, vacuum lamination apparatus 1211 and processes can be utilized to further improve the performance and reliability of the resulting multi-layer device 1203.

Variations of the apparatus and method described above are possible without departing from the scope of the invention.

The invention claimed is:

1. An apparatus for hybrid manufacturing of a multi-layered electro-optic device comprising:
   a roll-to-roll system for feeding a plurality of electro-optic modules, at least one of the plurality of electro-optic modules being on a flexible substrate, each of the electo-optic modules including a fully functional, thin-film electro-optic device having first and second conductive layers and at least first and second semiconductor layers disposed between said conductive layers, said first and second semiconductor layers defining a junction at an interface therebetween;
   an arrangement for monitoring and maintaining speed, tension and temperature of the modules as the modules traverse the roll-to-roll system;
   at least one pressure roller to exert a compression force for attaching two of said modules on top of each other in a continuous fashion; and
   an aligner system for positioning and laterally offsetting one of the modules over another of the modules.

2. The apparatus of claim 1, wherein each module comprises a plurality of segmented modules and further comprising a view-vision system for selecting the module segments, separating and detaching the module segments from a carrier film, and removing remaining unused module segments.

3. An apparatus for hybrid manufacturing of a multi-layered electro-optic device comprising:
   a pick and place system for handling a plurality of electro-optic modules, each of the electro-optic modules including a fully functional, thin-film electro-optic device having first and second conductive layers and at least first and second semiconductor layers disposed between said conductive layers, said first and second semiconductor layers defining a junction at an interface therebetween;
   at least one pressure member to exert a compression force for attaching two of said modules on top of each other in an automated fashion; and
   an aligner system for positioning and laterally offsetting one of the modules over another of the modules.

4. The apparatus of claim 3, wherein each module comprises a plurality of segmented modules and further comprising a view-vision system for assisting an alignment process between segments of different modules.

5. A process for manufacturing a hybrid electro-optic device comprising:

feeding a plurality of electro-optic modules through a roll-to-roll system, at least one of the modules having a flexible substrate, each of the modules including a fully functional, thin-film electro-optic device having first and second conductive layers and at least first and second semiconductor layers disposed between said conductive layers, said first and second semiconductor layers defining a junction at an interface therebetween;

positioning and aligning one of the modules over another of the modules;

monitoring and maintaining speed, tension and temperature of said modules while being fed through the roll-to-roll system;

exerting a compression force for attaching two of said modules on top each other.

6. The process of claim 5, further comprising a deposition of adhesive layers on at least one side of each of said modules.

7. The process of claim 5, further comprising laminating said modules on top of each other.

8. The process of claim 5, further comprising attaching a sacrificial flexible carrier to at least one of said modules.

9. The process of claim 5, further comprising exposing a portion of said conducting layers of each module and providing an electrical connection from each of the conducting layers to an external circuit.

10. The process of claim 5, wherein said modules are configured as panels and further comprising aligning and attaching said module panels on top of each other.

* * * * *